United States Patent
Zagorchev

(10) Patent No.: US 11,385,310 B2
(45) Date of Patent: Jul. 12, 2022

(54) FUNCTIONAL MAGNETIC RESONANCE IMAGING SYSTEMS AND METHODS

(71) Applicant: KONINKLIJKE PHILIPS N.V., Eindhoven (NL)

(72) Inventor: Lyubomir Georgiev Zagorchev, Burlington, MA (US)

(73) Assignee: Koninklijke Philips N.V., Eindhoven (NL)

(*) Notice: Subject to any disclaimer, the term of this patent is extended or adjusted under 35 U.S.C. 154(b) by 0 days.

(21) Appl. No.: 17/263,914

(22) PCT Filed: Jul. 30, 2019

(86) PCT No.: PCT/EP2019/070400
§ 371 (c)(1),
(2) Date: Jan. 28, 2021

(87) PCT Pub. No.: WO2020/025560
PCT Pub. Date: Feb. 6, 2020

(65) Prior Publication Data
US 2021/0302521 A1    Sep. 30, 2021

Related U.S. Application Data

(60) Provisional application No. 62/711,812, filed on Jul. 30, 2018.

(51) Int. Cl.
*G01R 33/48* (2006.01)
*G01R 33/54* (2006.01)
*G01R 33/56* (2006.01)

(52) U.S. Cl.
CPC ....... *G01R 33/4806* (2013.01); *G01R 33/543* (2013.01); *G01R 33/5608* (2013.01)

(58) Field of Classification Search
CPC .............. G01R 33/4806; G01R 33/543; G01R 33/5608
See application file for complete search history.

(56) References Cited

U.S. PATENT DOCUMENTS 6,292,683 B1 * 9/2001 Gupta .................. G06T 3/0075
324/309
9,256,951 B2   2/2016 Zagorchev
(Continued)

FOREIGN PATENT DOCUMENTS

WO   WO2017136285 A1   8/2017
WO   WO2019180054 A1   9/2019

OTHER PUBLICATIONS

PCT International Search Report, International application No. PCT/EP2019/070400, dated Nov. 11, 2019.
(Continued)

*Primary Examiner* — Susan S Lee

(57) ABSTRACT

Systems and methods for obtaining anatomical-structure-specific activation data in a brain of a patient are provided. In an embodiment, a method for obtaining anatomical-structure-specific activation data in a brain of a patient includes receiving magnetic resonance (MR) data of the brain obtained by use of a magnetic resonance imaging (MRI) device; segmenting the MR data of the brain to delineate a plurality of geometries, each of the plurality of geometries corresponding to a respective anatomical structure in the brain; receiving functional magnetic resonance (fMRI) data of the brain obtained by use of an MRI device; aligning the MR data and the fMRI data; determining a plurality of activation levels, each of the activation levels corresponding to respective delineated geometries based on the aligned MR data and fMRI data; and outputting a graphical representation of a dynamic activity in the brain
(Continued)

corresponding to the delineated geometries of the anatomical structures.

9 Claims, 7 Drawing Sheets

(56) References Cited

U.S. PATENT DOCUMENTS

| | | |
|---|---|---|
| 2011/0217240 A1 | 9/2011 | Ferris |
| 2015/0146951 A1 | 5/2015 | Zagorchev |
| 2019/0290130 A1* | 9/2019 | Zagorchev ......... G01R 33/4806 |

OTHER PUBLICATIONS

Taylor A. J. et al., "Characterization of the Gray Matter Hemodynamic Response Function with High-Resolution Functional MRI", International Society for Magnetic Resonance in Medicine, ISMRM, No. 5343, Apr. 7, 2017 (Apr. 7, 2017), XP040692910.

Zargochev L. et al., "Evaluation of Traumatic Brain Bnjury Patients Using a Shape-Constrained Deformable Model", Multimodal Brain Image Analysis (eds). MBIA 2011. Lecture Notes in Computer Science, vol. 7012. Springer, Berlin, Heidelberg, pp. 118-125.

Jaeggi S. M. et al., "Improving Fluid Intelligence with Training on Working Memory", Pro. Natl. Acad. Sc. (PNAS), May 13, 2008, vol. 105, No. 19, pp. 6829-6833.

* cited by examiner

FUNCTIONAL MAGNETIC RESONANCE IMAGING SYSTEMS AND METHODS

CROSS-REFERENCE TO RELATED APPLICATIONS

This patent application claims the priority benefit under 35 U.S.C. § 371 of International Patent Application no. PCT/EP2019/070400, filed Jul. 30, 2019, which claims the benefit of U.S. Application Ser. No. 62/711,812, filed on Jul. 30, 2018. These applications are hereby incorporated by reference herein in their entirety.

TECHNICAL FIELD

The present disclosure relates generally to functional magnetic resonance imaging, and in particular, to devices, systems, and methods for anatomical-structure-specific functional magnetic resonance imaging.

BACKGROUND

Functional magnetic resonance imaging (fMRI) is a variation of magnetic resonance imaging (MRI). fMRI relies on the fact that the oxygenated hemoglobin and deoxygenated hemoglobin have different magnetic properties that result in different magnetic resonance (MR) signal intensities. Because the cerebral blood flow bears a direct correlation with neuronal activation, by measuring the blood demand in a brain region, fMRI measures activation levels of that brain region. During an fMRI scan, a task designed to increase regional brain activities is administered to a patient and the MRI device can detect changes in the ratio of oxygenated and deoxygenated blood. The changes in the ratio of oxygenated and deoxygenated blood can be used to a task-related time series of metabolic activities of different regions in the patient's brain. This fMRI technique has been used to study cognitive functions in patients with neurodegenerative disorders, such as attention deficit disorder, traumatic brain injury, and Alzheimer's disease.

It is found that patients affected by neurodegenerative disorders suffer alterations in their ability to match cognitive processing activity and resources to cognitive demand. While conventionally this altered ability to match resources and demand can be imaged with the use of fMRI, considerable technical expertise is required for fMRI image acquisition and the subjective interpretive nature of the fMRI data have prevented extensive clinical use of the fMRI. Therefore, there is a need for an improved fMRI system and method.

SUMMARY

Embodiments of the present disclosure provide for systems and methods for obtaining anatomical-structure-specific activation data in a brain of a patient. For example, an embodiment of the present disclosure is directed to a method that includes automatically segmenting MR data of the brain to delineate a geometry of an anatomical structure, receiving fMRI data, aligning the MR data to the fMRI data, extracting an activation level of the anatomical structure, and output a graphical representation of the geometry and the activation level. By focusing on the activation levels of the anatomical structure, the method of the present disclosure also allows for a more streamlined fMRI acquisition procedure that results in suppressed noise levels.

Systems and methods for obtaining anatomical-structure-specific activation data in a brain of a patient are provided. In an embodiment, a method for obtaining anatomical-structure-specific activation data in a brain of a patient includes receiving magnetic resonance (MR) data of the brain obtained by use of a magnetic resonance imaging (MRI) device; segmenting the MR data of the brain to delineate a first geometry of a first anatomical structure in the brain; receiving functional magnetic resonance (fMRI) data of the brain obtained by use of an MRI device; aligning the MR data and the fMRI data; determining a first activation level within the first geometry of the first anatomical structure based on the aligned MR data and fMRI data; and outputting a graphical representation of the first geometry and the first activation level.

In some embodiments, the method further includes segmenting the MR data of the brain to delineate a second geometry of a second anatomical structure in the brain; determining a second activation level within the second geometry of the second anatomical structure in the brain based on the aligned MR data and fMRI data; and determining a sequence of activation among the first and second anatomical structures in the brain. In some embodiments, the graphical representation further includes the second geometry, the second activation level, and the sequence of activation. In some implementations, outputting the graphical representation includes outputting a brain activity map including the first and second geometries of the first and second anatomical structures. In some embodiments, the method further includes associating at least one of the first activation level or the first geometry with a diagnosis of the patient with respect to the brain. In some implementations, the method further includes storing, in a database, at least one of the first activation level or the first geometry associated with the diagnosis of the patient with respect to the brain. In some embodiments, the first activation level includes an average activation level. In some embodiments, the average activation level includes an event-average activation level.

In another embodiment, a method for obtaining anatomical-structure-specific activation data in a brain of a patient includes receiving magnetic resonance (MR) data of the brain obtained by use of a magnetic resonance imaging (MRI) device; segmenting the MR data of the brain to delineate a plurality of geometries, each of the plurality of geometries corresponding to a respective anatomical structure in the brain; receiving functional magnetic resonance (fMRI) data of the brain obtained by use of an MRI device; aligning the MR data and the fMRI data; determining a plurality of activation levels, each of the activation levels corresponding to the respective delineated geometries based on the aligned MR data and fMRI data; and outputting a graphical representation of a propagation of activity in the brain based on the activation levels and the respective delineated geometries. Some embodiments of the method further include determining a sequence of activation of the anatomical structures based on the delineated geometries and the corresponding activation levels; and the graphical representation of the propagation of activity further comprises the sequence of activation. Some of the embodiments of the method further include a graphical representation of temporal features of the propagation activity. By focusing on the activation levels within the anatomical structures and the propagation of activity over time from one anatomical structure to another, the method of the present disclosure also allows for a more streamlined fMRI acquisition procedure that results in suppressed noise levels. In another embodiments, a system for obtaining anatomical-structure-specific activation data in a brain of a patient is provided. The system includes a computing device in communication with a magnetic resonance imaging (MRI) device. The computing device is operable to obtain magnetic resonance (MR) data of the brain, by use of a magnetic resonance imaging (MRI) device; segment the MR data of the brain to delineate a first geometry of a first anatomical structure in the brain; obtain functional magnetic resonance (fMRI) data of the brain, by use of the MRI device; align the MR data and the fMRI data; determine a first activation level within the first geometry of the first anatomical structure based on the aligned MR data and fMRI data; and output a graphical representation of the first geometry and the first activation level. In some embodiments, the system further includes the MRI device. In some embodiments, the computing device is further operable to segment the MR data of the brain to delineate a second geometry of a second anatomical structure in the brain, extract a second activation level within the second geometry of the second anatomical structure in the brain based on the aligned MR data and fMRI data, and extract a sequence of activation among the first and second anatomical structures in the brain.

Embodiments of the present disclosure provide for systems and methods for obtaining anatomical-structure-specific activation data in a brain of a patient. For example, an embodiment of the present disclosure is directed to a method that includes automatically segmenting MR data of the brain to delineate geometry of anatomical structures, receiving fMRI data, aligning the MR data to the fMRI data, extracting the activation level within anatomical structures, and output a graphical representation of the geometry and the activation level for delineated brain regions. By focusing on the activation levels within anatomical structures and the propagation of activity over time from one anatomical region to another, the method of the present disclosure also allows for a more streamlined fMRI acquisition procedure that results in suppressed noise levels.

Systems and methods for obtaining anatomical-structure-specific activation data in a brain of a patient are provided. In an embodiment, a method for obtaining anatomical-structure-specific activation data in a brain of a patient includes receiving magnetic resonance (MR) data of the brain obtained by use of a magnetic resonance imaging (MRI) device; segmenting the MR data of the brain to delineate a plurality of geometries, each of the plurality of geometries corresponding to a respective anatomical structure in the brain; receiving functional magnetic resonance (fMRI) data of the brain obtained by use of an MRI device; aligning the MR data and the fMRI data; determining a plurality of activation levels, each of the activation levels corresponding to respective delineated geometries based on the aligned MR data and fMRI data; and outputting a graphical representation of a dynamic activity in the brain corresponding to the delineated geometries of the anatomical structures.

In some embodiments, the method further includes determining a sequence of activation of the anatomical structures based on the delineated geometries and the corresponding activation levels, and the graphical representation of the dynamic activity further includes the sequence of activation. In some embodiments, determining a propagation of activity from one delineated geometry to another delineated geometry, and the graphical representation of the dynamic activity further comprises the propagation of activity. In some implementations, outputting the graphical representation of the dynamic activity includes outputting a brain activity map including at least one of the geometries. In some implementations, the method further includes storing, in a database, the activation level or geometry associated with the diagnosis of the patient. In some embodiments, the activation levels include an average activation level. In some embodiments, the average activation level includes an event-average activation level.

In another embodiments, a system for obtaining anatomical-structure-specific activation data in a brain of a patient is provided. The system includes a computing device in communication with a magnetic resonance imaging (MRI) device. The computing device is operable to receive magnetic resonance (MR) data of the brain, obtained by use of a magnetic resonance imaging (MRI) device; segment the MR data of the brain to delineate a plurality of geometries, each of the plurality of geometries corresponding to a respective anatomical structure in the brain; receive functional magnetic resonance (fMRI) data of the brain obtained by use of an MRI device; align the MR data and the fMRI data; determine a plurality of activation levels, each of the activation levels corresponding to the respective delineated geometries based on the aligned MR data and fMRI data. In some embodiments, the computing device is further operable to output a graphical representation of a dynamic activity in the brain corresponding to the delineated geometries of the anatomical structures. In some implementations, the computing device is further operable to associate at least one of the activation levels, the corresponding geometries, and the sequence of activation with a diagnosis of the patient with respect to the brain. In some instances, the computing device is further operable to store, in a database, activation levels, the corresponding geometries, and the sequence of activation associated with the diagnosis of the patient with respect to the brain. In some embodiments, the system further includes the database.

Other devices, systems, and methods specifically configured to interface with such devices and/or implement such methods are also provided.

Additional aspects, features, and advantages of the present disclosure will become apparent from the following detailed description along with the drawings.

BRIEF DESCRIPTIONS OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. In addition, the present disclosure may repeat reference numerals and/or letters in the various examples. This repetition is for the purpose of simplicity and clarity and does not in itself dictate a relationship between the various embodiments and/or configurations discussed.

Figure 4:
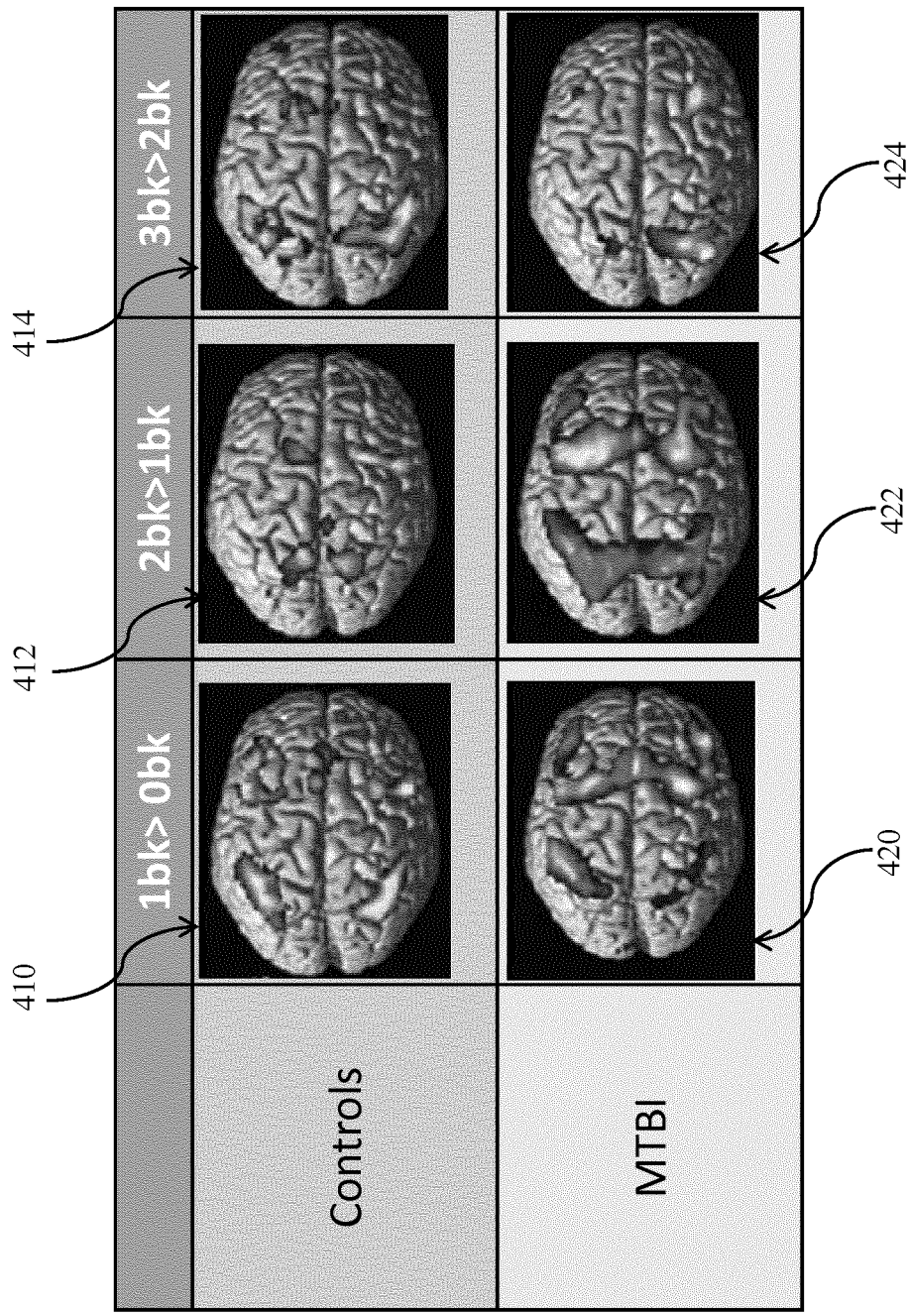

FIG. 4 demonstrates fMRI images of activation levels in a brain of a patient at different stimulation levels, according to aspects of the present disclosure.

Figure 5:

FIG. 5 is an MR image of a brain of a patient overlaid with a highlighted boundaries of the geometries of anatomical structures, according to aspects of the present disclosure.

Figure 6:
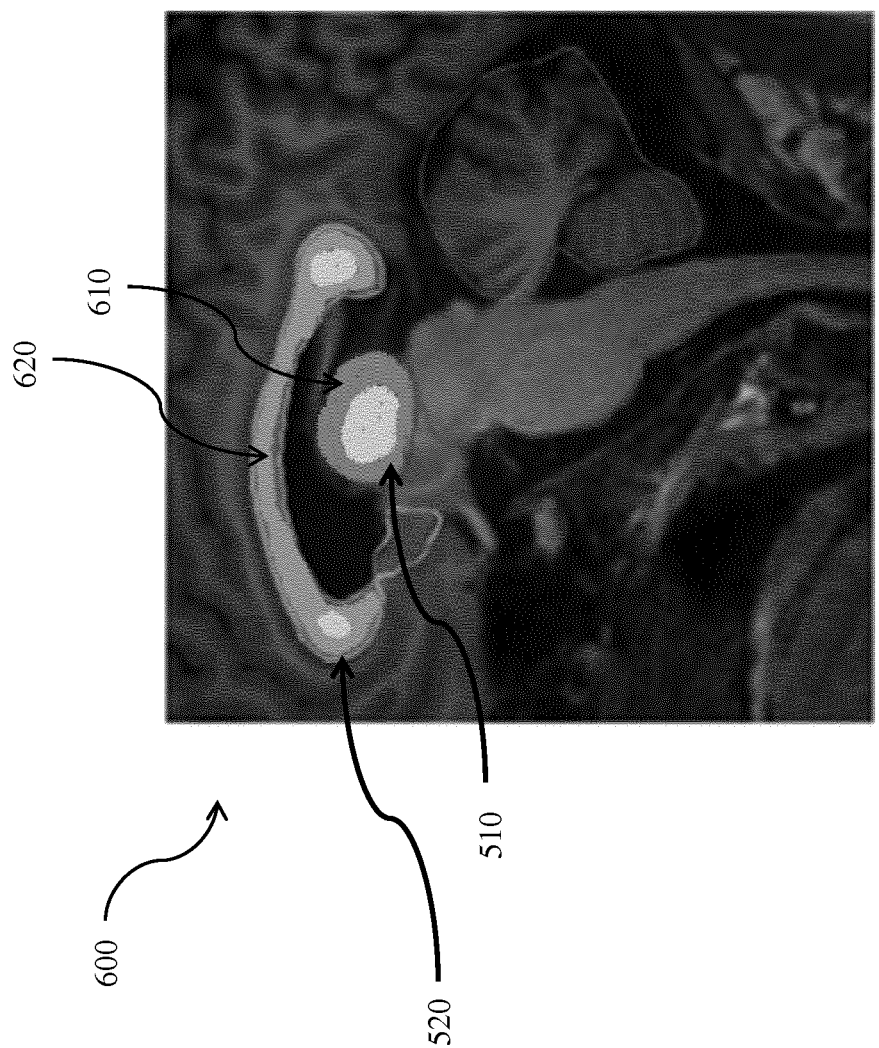

FIG. 6 is a graphical representation of activation levels within an anatomical structure of the brain, according to aspects of the present disclosure.

Figure 7:
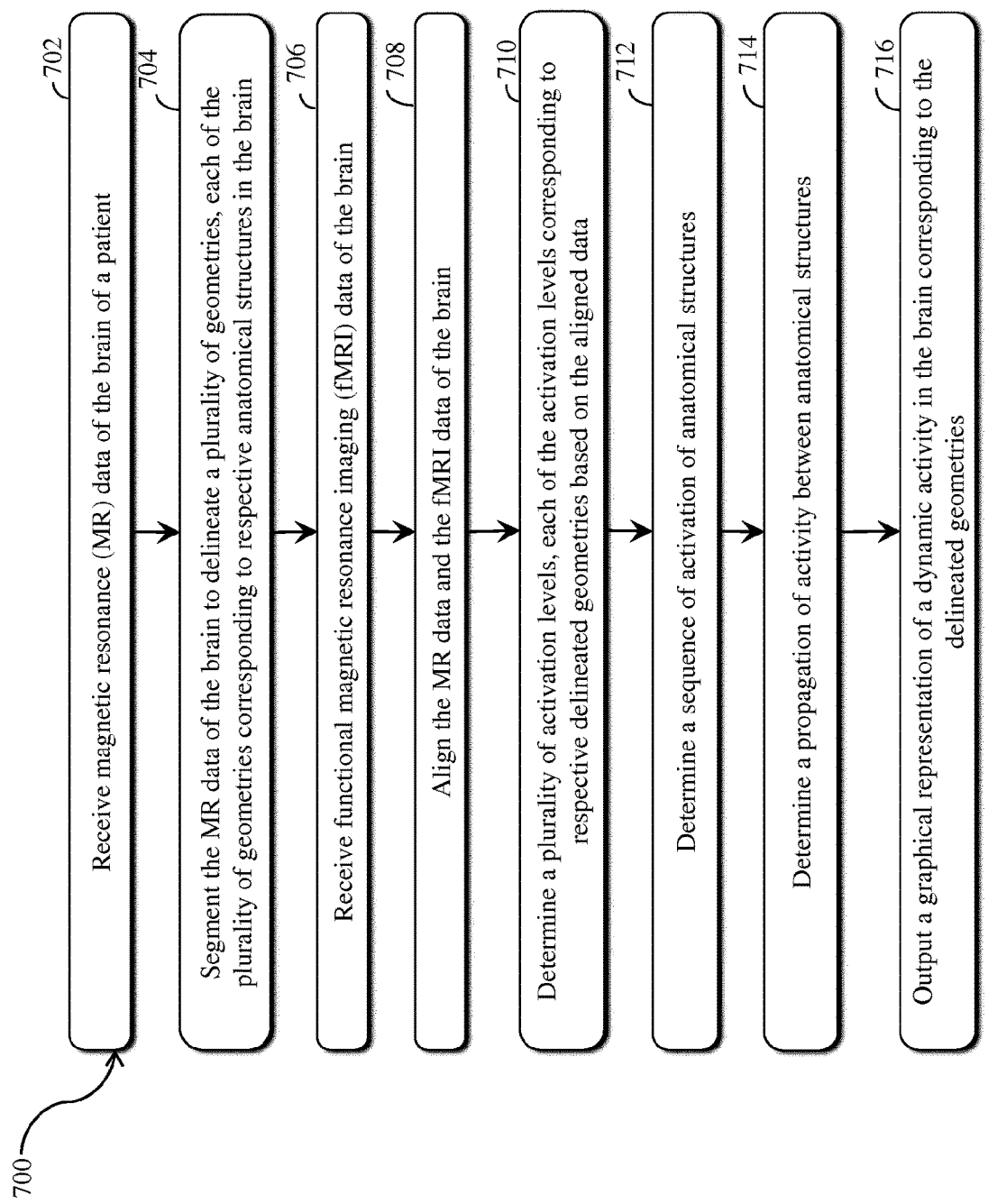

FIG. 7 is a flowchart illustrating another method of obtaining anatomical-structure-specific activation data in a brain of a patient, according to aspects of the present disclosure.

DETAILED DESCRIPTION

For the purposes of promoting an understanding of the principles of the present disclosure, reference will now be made to the embodiments illustrated in the drawings, and specific language will be used to describe the same. It is nevertheless understood that no limitation to the scope of the disclosure is intended. Any alterations and further modifications to the described devices, systems, and methods, and any further application of the principles of the present disclosure are fully contemplated and included within the present disclosure as would normally occur to one skilled in the art to which the disclosure relates.

Figure 1:
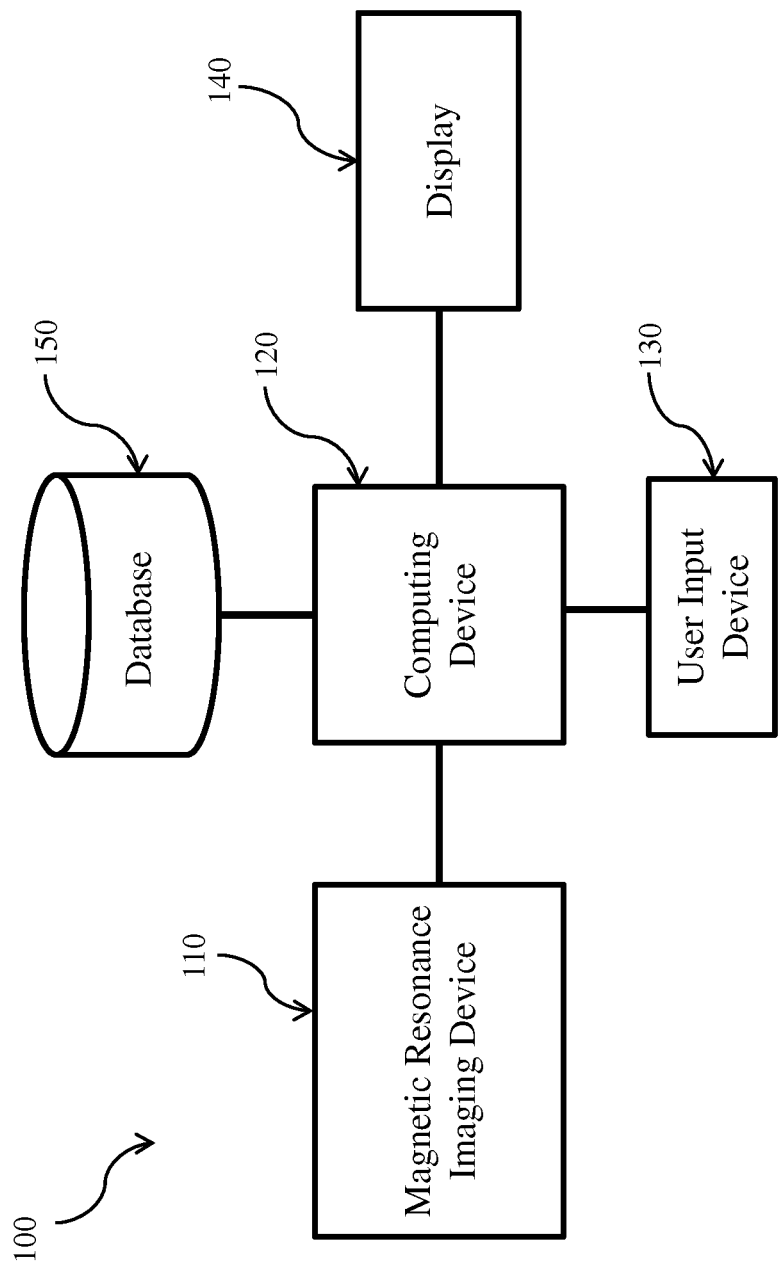
FIG. 1 is a schematic diagram of a system for obtaining anatomical-structure-specific activation data in a brain of a patient, according to aspects of the present disclosure.

Referring now to FIG. 1, shown therein is a schematic diagram of a system 100 for obtaining anatomical-structure-specific activation data in a brain of a patient. The system 100 includes a computing device 120 connected to a magnetic resonance imaging (MRI) device 110, a user input device 130, and a display 140. The computing device 120 includes a processing circuit, such as one or more processors in communication with memory. The memory can be tangible computer readable storage media that stores instructions that are executable by the one or more processors. The computing device 120 can be a workstation or a controller that serves as an interface between the MRI device 110 and the display 140. In some embodiments, the MRI device 110 can operate in different modalities, including but not limited to magnetic resonance (MR) imaging, diffusion tensor imaging (DTI), and positron emission tomography (PET) imaging, functional magnetic resonance imaging (fMRI) and output imaging data to the computing device 120. In some implementations, the MRI device 110 can operate in different modalities at the same time. For example, the MRI device can perform MR scans and PET scans simultaneously or MR scans and DTI scans simultaneously.

In some embodiments, the computing device 120 can receive MR data from the MRI device 110, process the same and output MR image data to the display 140 such that the display 140 can display MR images. In some embodiments, the computing device 120 can receive fMRI data from the MRI device 110, process the same and output the fMRI data to the display 140 for display of fMRI images. In some embodiments, the computing device 120 can align the MR data and the fMRI data through suitable processes, such as survey scans, rigid registration, volume localization and direction cosines.

In some embodiments, the MR data can be T1 weighted (T1W) MR images and the computing device 120 can automatically segment the MR image to delineate geometries of anatomical structures in the brain of the patient. In some implementations, the computing device 120 can segments the MR image data based on a three-dimensional (3D) brain model. In some instances, the 3D brain model is received by the computing device 120 from a storage media or through wired or wireless connection to a server or a remote workstation. In some other instances, the 3D brain model can be stored in a storage device in the computing device 120 or a storage device retrievable by the computing device 120. In some implementations, the 3D brain model is a shape-constrained deformable brain model. In some instances, the 3D brain model may be the brain model described in "Evaluation of traumatic brain injury patients using a shape-constrained deformable model," by L. Zagorchev, C. Meyer, T. Stehle, R. Kneser, S. Young and J. Weese, 2011, in *Multimodal Brain Image Analysis* by Liu T., Shen D., Ibanez L., Tao X. (eds). MBIA 2011. *Lecture Notes in Computer Science*, vol. 7012. Springer, Berlin, Heidelberg, the entirety of which is hereby incorporated by reference. In some embodiments, the 3D brain model may be the deformable brain model described in U.S. Pat. No. 9,256,951, titled "SYSTEM FOR RAPID AND ACCURATE QUANTITATIVE ASSESSMENT OF TRAUMATIC BRAIN INJURY" or the shape-constrained deformable brain model described in U.S. Pat. App. Pub. No. 20150146951, titled "METHOD AND SYSTEM FOR QUANTITATIVE EVALUATION OF IMAGE SEGMENTATION," each of which is hereby incorporated by reference in its entirety.

In some embodiments, the automatic segmentation not only delineates the geometries of anatomical structures in the brain but also defines a plurality of voxels in each of the geometries. With the MR data and the fMRI data aligned, the geometries and voxels can be transferred to the fMRI space. In some implementations, the computing device 120 can determine an activation level within a voxel, wherein the activation level can be an accumulated activation level, an instantaneous activation level, a time-average activation level, or an event-average activation level. With the activation level for each of the voxel known, the computing device 120 can then determine an activation level within a geometry of an anatomical structure by integrating the activation levels of all voxels within the geometry. In some embodiments, the computing device 120 can use color coding to denote different activation levels, be they accumulated activation levels, instantaneous activation levels, time-average activation levels, or event-average activation levels. In some implementations, the computing device 120 can also output activation level contours within a geometry based on the activation level of the voxels in the geometry. In some embodiments, the computing device 120 can output a graphical representation of the determined activation levels within the geometry the display 140.

In some embodiments, the MR data and fMRI data include information about multiple geometries of different anatomical structures of the patient's brain. When tasks designed to increase regional brain activity are administrated to the patient, the activation levels within geometries of different anatomical structures may assume a sequence or pattern over time. For example, a first high average activation level can be observed within a first anatomical structure, and then a second high average activation level can be observed within a second anatomical structure. The computing device 120 can also determine a sequence or pattern of activation among the anatomical structures.

In some embodiments, the computing device 120 can be used to develop biomarkers for neurological disorders. In some implementations, the computing device 120 can receive a diagnosis for a neurological disorder (or lack thereof) of the patient and associate the activation levels with each anatomical structure and the sequence/pattern of activation among various anatomical structures with the diagnosis. In some embodiments, the computing device 120 can store the activation levels, anatomical structures, and sequence/pattern of activation according to the received diagnosis in a database 150 in communication with the computing device 120. The computing device 120 can access the database 150 to determine a biomarker or a signature of a neurological disorder.

Figure 2:
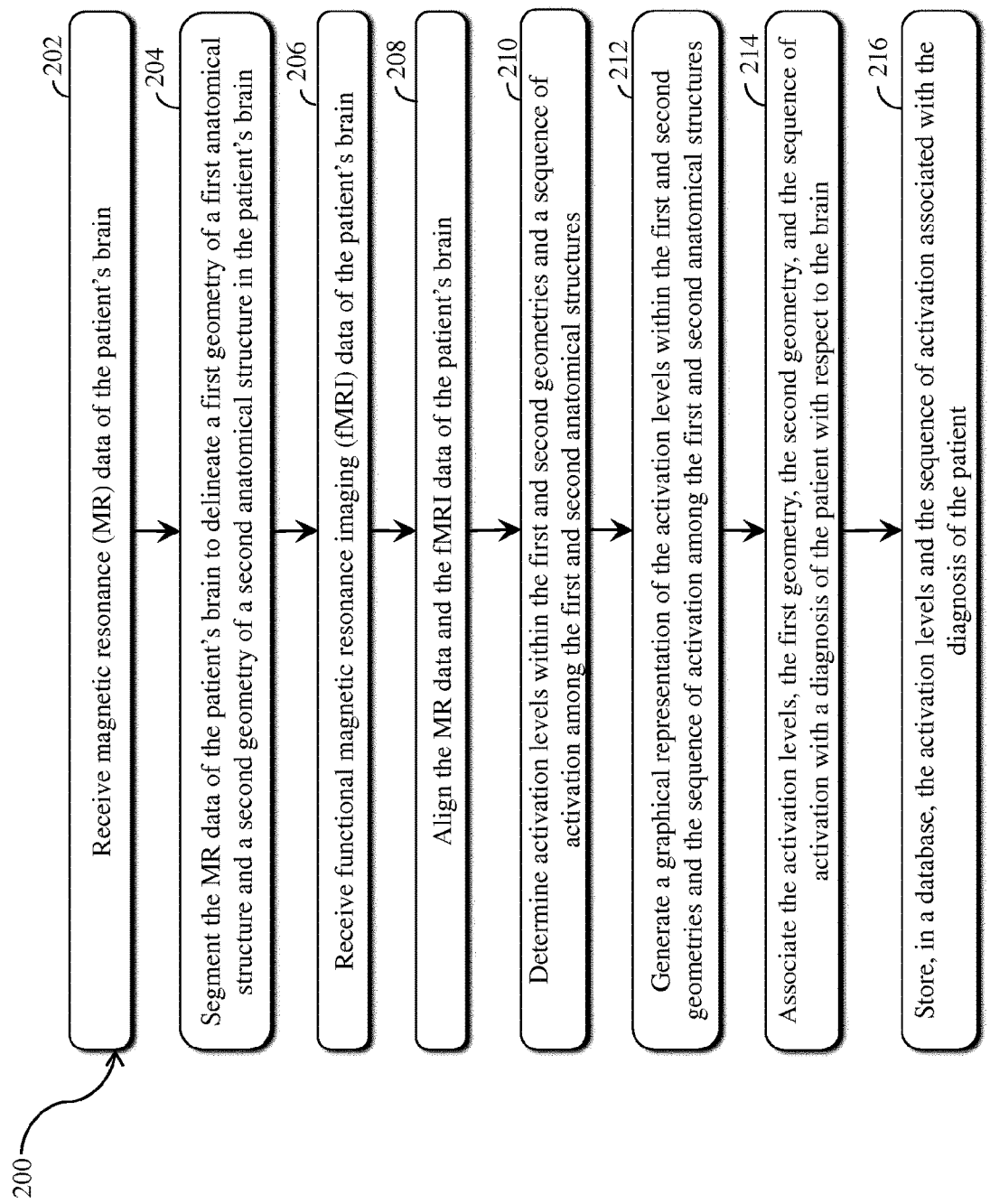
FIG. 2 is a flowchart illustrating a method of obtaining anatomical-structure-specific activation data in a brain of a patient, according to aspects of the present disclosure.

Referring now to FIG. 2, shown therein is a flowchart illustrating am exemplary method 200 of obtaining anatomical-structure-specific activation data in a brain of a patient. The method 200 includes operations 202, 204, 206, 208, 210, 212, 214, and 216. It is understood that the operations of method 200 may be performed in a different order than shown in FIG. 2, additional operations can be provided before, during, and after the operations, and/or some of the operations described can be replaced or eliminated in other embodiments. The operations of the method 200 can be carried out by a computing device in a fMRI system, such as the computing device 120 of the system 100. The method 200 will be described below with reference to FIGS. 3, 4, 5, and 6.

Figure 3:
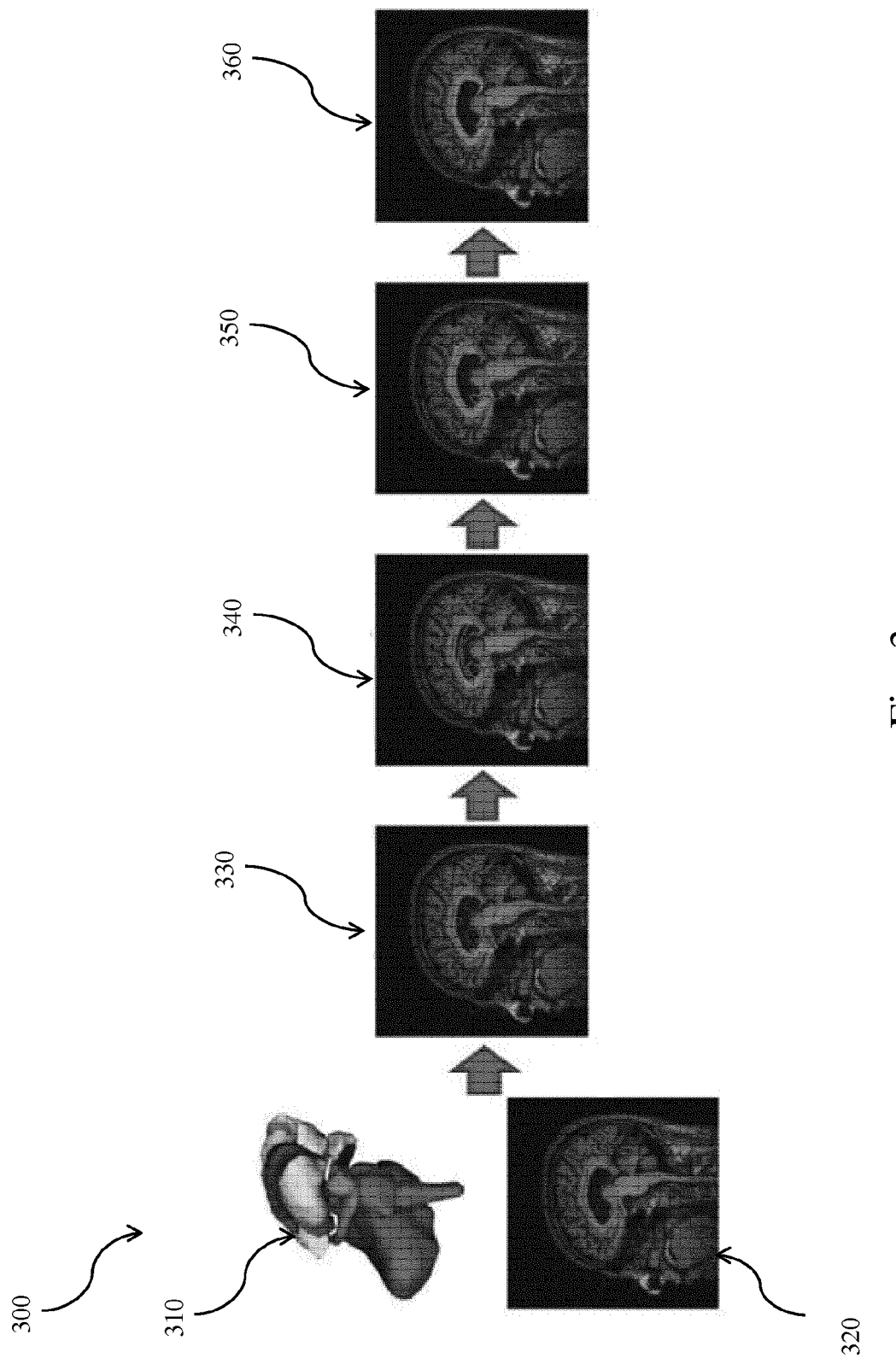
FIG. 3 is a schematic diagram illustrating a process flow for segmenting MR image to delineate a geometry of an anatomical structure, according to aspects of the present disclosure.

At operation 202 of the method 200, MR data of the patient's brain is received at the computing device 120. The MR data is obtained by use of an MRI device 110. In some embodiments, the MRI device 110 is in communication with the computing device 120. The computing device 120 can process the MR data of a patient's brain and output MR image data to the display 140 to display an MR image, such as the MR image 320 in FIG. 3. In some embodiments, the MR data includes T1W MR data. While the MR image 320 shown in FIG. 3 is a top view of the patient's brain, a person of ordinary skill in the art would understand that MR images of the patient's brain viewed from other directions can be obtained or derived by the computing device 120 as well. The MR data received at operation 202 includes MR data of anatomical structures in the patient's brain.

At operation 204 of the method 200, the MR data of the patient's brain are segmented to delineate a first geometry of a first anatomical structure and a second geometry of a second anatomical structure in the patient's brain. Referring now to FIG. 3, shown therein is a process flow 300 for segmenting the MR data to delineate geometries of anatomical structures in the brain of the patient. In some embodiments, the computing device 120 can segment the MR data of the patient's brain, represented by the MR image 320, based on a 3D brain model 310. In some embodiments, the 3D brain model 310 can be a shape-constrained deformable brain model. In some instances, the 3D brain model 310 may be the brain model described in "Evaluation of traumatic brain injury patients using a shape-constrained deformable model," by L. Zagorchev, C. Meyer, T. Stehle, R. Kneser, S. Young and J. Weese, 2011, in *Multimodal Brain Image Analysis* by Liu T., Shen D., Ibanez L., Tao X. (eds). MBIA 2011. *Lecture Notes in Computer Science*, vol. 7012. Springer, Berlin, Heidelberg, the entirety of which is hereby incorporated by reference. In some instances, the 3D brain model may be the deformable brain model described in U.S. Pat. No. 9,256,951, titled "SYSTEM FOR RAPID AND ACCURATE QUANTITATIVE ASSESSMENT OF TRAUMATIC BRAIN INJURY" or the shape-constrained deformable brain model described in U.S. Pat. App. Pub. No. 20150146951, titled "METHOD AND SYSTEM FOR QUANTITATIVE EVALUATION OF IMAGE SEGMENTATION," each of which is hereby incorporated by reference in its entirety. In some implementations, the 3D brain model 310 is stored in the computing device 120 or a storage device or medium retrievable by the computing device 120.

As shown in MR image 330, the 3D brain model 310 is initialized by being matched to the MR image 320 of the brain. Then a generalized Hough transformation (GHT) is performed on the 3D brain model 310 to match the 3D brain model 310 to the geometries of the anatomical structures in the MR image 320 in terms of location and orientation, as illustrated in MR image 340. Thereafter, as shown in MR image 350, the 3D brain model 310 goes through parametric adaptation where location, orientation and scaling are adjusted using a global similarity transformation and/or a multi-linear transformation to better adapt to the anatomical structures in the MR image 320. As illustrated by MR image 360, the 3D brain model 310 undergoes deformable adaptation where multiple iterations of boundary detection and adjustment of meshes in 3D brain model 310 are performed to adapt the 3D brain model to anatomical structures in the brain.

At operation 206 of the method 200, fMRI data of the patient's brain is received at the computing device 120. The fMRI data is obtained using an MRI device. In some embodiments, the MRI device 110 to obtain the MR data is the same as the MRI device 110 to obtain the fMRI data. In some embodiments, the MRI device 110 is in communication with the computing device 120. fMRI relies on the fact the oxygenated hemoglobin and deoxygenated hemoglobin have different magnetic properties that result in different magnetic resonance (MR) signal intensities. Because the cerebral blood flow bears a direct correlation with neuronal activation, by measuring the blood demand in a brain region, fMRI measures activation levels of that brain region. In addition, because the demand for blood can represent demand for oxygen, fMRI can also be a tool and technique to measure oxygen demand in a brain region. During an fMRI scan, a task designed to increase regional brain activities is administered to a patient and the MRI device can detect changes in the ratio of oxygenated and deoxygenated blood.

For example, the task can be a dual N-back task. In a dual N-back task, a patient is presented with a series of visual stimuli and auditory stimuli simultaneously. In some implementations, a patient starts with a 1-back condition, where he/she is required to provide an affirmative response if the present visual stimulus matches the immediately preceding visual stimulus. Likewise, if the present auditory stimulus matches the immediately preceding auditory stimulus, the patient is required to provide an affirmative response. If both the present visual and auditory stimuli match the immediately preceding visual and auditory stimuli, the patient is asked to provide a double affirmative response. If none of the stimuli matches, no response is required. If the accuracy rate of the patient reaches a certain level, the n-back level is increased by one (e.g. from 1-back to 2-back). If the accuracy level falls below a certain level, the n-back level is decrease by one (e.g. from 3-back to 2-back). In some instances, if the accuracy level of the patient is maintained at a certain level, the n-back level remains unchanged. The dual N-back task is described in Susanne M. Jaeggi et al., *Improving Fluid Intelligence with Training on Working Memory*, Pro. Natl. Acad. Sc. U.S. A., 2008 May 13; 105(19): 6829-6833.

At operation 208 of the method 200, the MR data of the brain of the patient is aligned with the fMRI data of the brain of the patient. In some embodiments, the computing device 120 can align the MR data and the fMRI data through suitable processes, such as survey scans, rigid registration, volume localization and direction cosines. In some embodiments, if the radiologist is only required to obtain fMRI image of one or more target anatomical structures, the radiologist only needs to ensure that a predetermined desirable activation level is met for the one or more target anatomical structures. Compared to the conventional practice where the predetermined desirable activation level has to be met throughout all the anatomical structures in the fMRI field of view, the method 200 of the present disclosure saves time and can be performed in a shorter period of time.

At operation 210 of the method 200, the activation levels within geometries of anatomical structures and a sequence of activation among these anatomical structures are determined. Referring now to FIG. 5, shown therein is an MR image 500 of a brain of a patient overlaid with highlighted boundaries of the geometries of anatomical structures, including a geometry of thalamus 510 and corpus callosum 520. In some embodiments, with the MR data automatically segmented at operation 204 and the MR data aligned with the fMRI data at operation 208, the computing device 120 can determine a first activation level within a first geometry (for example, the geometry of the thalamus 510) and a second activation level within a second geometry (for example, the geometry of the corpus callosum 520. The first and second activation levels here can be accumulated activation levels, instantaneous activation levels, time-average activation levels, or event-average activation levels. In addition, the computing device 120 can determine a pattern or sequence of the activation in different anatomical structures. For example, the first activation level in the geometry of thalamus 510 may increase while the second activation level in the geometry of the corpus callosum 520 is on the increase and then the second activation level can increase in response to a dual N-back task while the first activation level wanes in response to the same task. Besides quantitative intensities of activation levels, the pattern/sequence of the activation among different anatomical structure in response to a task or stimulation can also be indicative of a neurological disorder or condition.

FIG. 4 shows activation levels in control subjects' brains and activation levels in brains of subjects with mild traumatic brain injury (MTBI) when the subjects were subjected to dual N-back tasks. When the N-back level changes from 1-back to 0-back, the activation levels in control subjects' brains are shown in fMRI image 410 and the activation levels in MTBI subjects' brains are shown in fMRI image 420. When the N-back level changes from 2-back to 1-back, the activation levels in control subjects' brains are shown in fMRI image 412 and the activation levels in MTBI subjects' brains are shown in fMRI image 422. When the N-back level changes from 3-back to 2-back, the activation levels in control subjects' brains are shown in fMRI image 414 and the activation levels in MTBI subjects' brains are shown in fMRI image 424. The changes in the ratio of oxygenated and deoxygenated blood can be used to a task-related time series of metabolic activities of different regions in the patient's brain. As can be seen in FIG. 4, while the difference in pattern and intensity of the activation levels are observable in fMRI images 410, 412, 414, 420, 422, and 424, the activation levels are not attributed to any geometry of a specific anatomical structure. Without anatomical-structure-specific activation levels, the activation levels within a specific anatomical structure cannot be quantified and meaningfully associated to a specific neurological disorder. The systems and methods of the present disclosure achieve just that. By segmenting the MR data and aligning the MR data with the fMRI data, the activation level, which can be an accumulated activation level, an instantaneous activation level, a time-average activation level, or an event-average activation level, in each of the geometries of the anatomical structures can be determined and associated with diagnosis of the patient.

At operation 212 of the method 200, a graphical representation of the first activation level within the first geometry, the second activation level within the second geometry, the sequence of activation among the first and second anatomical structures is generated. Referring to FIG. 6, illustrated therein is an exemplary graphical representation 600 of activation levels within the first geometry of thalamus 510 of the brain. The graphical representation 600 in FIG. 6 can also be referred to as a brain activity map or an anatomical-structure-specific brain activity map. As shown in FIG. 6, the first activation level within the geometry of the thalamus 510 is graphically represented by a graphical overlay 610. In some embodiments represented by FIG. 6, the graphical overlay 610 includes color-coded contours of different activation levels. As used herein, activation levels can be accumulated activation levels, instantaneous activation levels, time-average activation levels, or event-average activation levels. In those embodiments, the darker color near the edge of the first geometry of the thalamus 510 represents lower activation levels than the lighter color near the center of the first geometry of the thalamus 510. Similarly, the second activation level within the geometry of the corpus callosum 520 is graphically represented by a graphical overlay 620. The graphical overlay 620 also includes color-coded contours of different activation levels. The darker color along the length of the second geometry of the corpus callosum 520 represents lower activation levels than the lighter color near either end (e.g., splenium of corpus callosum and genu of corpus callosum) of the second geometry of the corpus callosum 520. It is noted that the graphical representation 600 is for illustration purposes only and does not necessarily correspond to a real-world brain activity map.

Different from the fMRI images shown in FIG. 4, the first activation level is specific to the first geometry of the thalamus 510 and is not an activation level over a region that merely includes the first geometry. The method 200 of the present disclosure therefore allows for determination of anatomical-structure-specific activation levels. The ability to determine anatomical-structure-specific activation levels eliminates the subjectivity in visually matching the activity level to an anatomical structure, thus reducing the level of expertise required to interpret fMRI data.

At operation 214 of the method 200, the first activation level, the second activation level, the first geometry, the second geometry, and the sequence of activation among the first and second anatomical structures with a diagnosis of the patient with respect to the brain. In some embodiments, a diagnosis of a physician can be received by the computing device 120. The diagnosis can either be positive, indicating that the patient suffers from at least one neurological disorder or negative, indicating that the patient is free of all neurological disorders. It is noted that the diagnosis here is not necessarily rendered solely based on the fMRI data but is based on all tests and examinations performed on the patient. In some embodiments, if the diagnosis of a patient is negative, the activation levels, geometries of anatomical structures and sequence of activation will be associated with a healthy subject. In some embodiments, if the diagnosis of a patient is positive, the activation levels, geometries of anatomical structures, and sequence of activation will be associated with the neurological disorder(s) identified in the diagnosis of the patient.

At operation 216 of the method 200, the activation levels within the geometries of the anatomical structures, geometries of anatomical structures, and the sequence of activation among the anatomical structures, being associated with the diagnosis of the patient with respect to the brain, are stored in a database, such as the database 150. Over time, the database 150 can store activation levels and sequences of activation of more healthy subjects and activation levels and sequences of activation of more subjects with neurological disorders. fMRI biomarkers of neurological disorders can be detected and developed based on the data stored in the database 150.

Referring now to FIG. 7, shown therein is a flowchart illustrating am exemplary method 700 of obtaining anatomical-structure-specific activation data in a brain of a patient. The method 700 includes operations 702, 704, 706, 708, 710, 712, 714, and 716. It is understood that the operations of method 700 may be performed in a different order than shown in FIG. 7, additional operations can be provided before, during, and after the operations, and/or some of the operations described can be replaced or eliminated in other embodiments. The operations of the method 700 can be carried out by a computing device in a fMRI system, such as the computing device 120 of the system 100. The method 700 will be described below with reference to FIGS. 3, 4, 5, and 6.

At operation 702 of the method 700, MR data of the patient's brain is received at the computing device 120. The MR data is obtained by use of an MRI device 110. In some embodiments, the MRI device 110 is in communication with the computing device 120. The computing device 120 can process the MR data of a patient's brain and output MR image data to the display 140 to display an MR image, such as the MR image 320 in FIG. 3. In some embodiments, the MR data includes T1W MR data. While the MR image 320 shown in FIG. 3 is a top view of the patient's brain, a person of ordinary skill in the art would understand that MR images of the patient's brain viewed from other directions can be obtained or derived by the computing device 120 as well. The MR data received at operation 702 includes MR data of anatomical structures in the patient's brain.

At operation 704 of the method 700, the MR data of the patient's brain are segmented to delineate a plurality of geometries. Each of the plurality of geometries corresponds to respective anatomical structures in the patient's brain. Referring now to FIG. 3, shown therein is a process flow 300 for segmenting the MR data to delineate geometries of anatomical structures in the brain of the patient. In some embodiments, the computing device 120 can segment the MR data of the patient's brain, represented by the MR image 320, based on a 3D brain model 310. In some embodiments, the 3D brain model 310 can be a shape-constrained deformable brain model. In some instances, the 3D brain model 310 may be the brain model described in "Evaluation of traumatic brain injury patients using a shape-constrained deformable model," by L. Zagorchev, C. Meyer, T. Stehle, R. Kneser, S. Young and J. Weese, 2011, in *Multimodal Brain Image Analysis* by Liu T., Shen D., Ibanez L., Tao X. (eds). MBIA 2011. *Lecture Notes in Computer Science*, vol. 7012. Springer, Berlin, Heidelberg, the entirety of which is hereby incorporated by reference. In some instances, the 3D brain model may be the deformable brain model described in U.S. Pat. No. 9,256,951, titled "SYSTEM FOR RAPID AND ACCURATE QUANTITATIVE ASSESSMENT OF TRAUMATIC BRAIN INJURY" or the shape-constrained deformable brain model described in U.S. Pat. App. Pub. No. 20150146951, titled "METHOD AND SYSTEM FOR QUANTITATIVE EVALUATION OF IMAGE SEGMENTATION," each of which is hereby incorporated by reference in its entirety. In some implementations, the 3D brain model 310 is stored in the computing device 120 or a storage device or medium retrievable by the computing device 120.

As shown in MR image 330, the 3D brain model 310 is initialized by being matched to the MR image 320 of the brain. Then a generalized Hough transformation (GHT) is performed on the 3D brain model 310 to match the 3D brain model 310 to the geometries of the anatomical structures in the MR image 320 in terms of location and orientation, as illustrated in MR image 340. Thereafter, as shown in MR image 350, the 3D brain model 310 goes through parametric adaptation where location, orientation and scaling are adjusted using a global similarity transformation and/or a multi-linear transformation to better adapt to the anatomical structures in the MR image 320. As illustrated by MR image 360, the 3D brain model 310 undergoes deformable adaptation where multiple iterations of boundary detection and adjustment of meshes in 3D brain model 310 are performed to adapt the 3D brain model to anatomical structures in the brain.

At operation 706 of the method 700, fMRI data of the patient's brain is received at the computing device 120. The fMRI data is obtained using an MRI device. In some embodiments, the MRI device 110 to obtain the MR data is the same as the MRI device 110 to obtain the fMRI data. In some embodiments, the MRI device 110 is in communication with the computing device 120. fMRI relies on the fact the oxygenated hemoglobin and deoxygenated hemoglobin have different magnetic properties that result in different magnetic resonance (MR) signal intensities. Because the cerebral blood flow bears a direct correlation with neuronal activation, by measuring the blood demand in a brain region, fMRI measures activation levels of that brain region. In addition, because the demand for blood can represent demand for oxygen, fMRI can also be a tool and technique to measure oxygen demand in a brain region. During an fMRI scan, a task designed to increase regional brain activities is administered to a patient and the MRI device can detect changes in the ratio of oxygenated and deoxygenated blood.

For example, the task can be a dual N-back task. In a dual N-back task, a patient is presented with a series of visual stimuli and auditory stimuli simultaneously. In some implementations, a patient starts with a 1-back condition, where he/she is required to provide an affirmative response if the present visual stimulus matches the immediately preceding visual stimulus. Likewise, if the present auditory stimulus matches the immediately preceding auditory stimulus, the patient is required to provide an affirmative response. If both the present visual and auditory stimuli match the immediately preceding visual and auditory stimuli, the patient is asked to provide a double affirmative response. If none of the stimuli matches, no response is required. If the accuracy rate of the patient reaches a certain level, the n-back level is increased by one (e.g. from 1-back to 2-back). If the accuracy level falls below a certain level, the n-back level is decreased by one (e.g. from 3-back to 2-back). In some instances, if the accuracy level of the patient is maintained at a certain level, the n-back level remains unchanged. The dual N-back task is described in Susanne M. Jaeggi et al.,

*Improving Fluid Intelligence with Training on Working Memory*, Pro. Natl. Acad. Sc. U.S. A., 2008 May 13; 105(19): 6829-6833.

At operation 708 of the method 700, the MR data of the brain of the patient is aligned with the fMRI data of the brain of the patient. In some embodiments, the computing device 120 can align the MR data and the fMRI data through suitable processes, such as survey scans, rigid registration, volume localization and direction cosines. In some embodiments, if the radiologist is only required to obtain fMRI image of one or more target anatomical structures, the radiologist only needs to ensure that a predetermined desirable activation level is met for the one or more target anatomical structures. Compared to the conventional practice where the predetermined desirable activation level has to be met throughout all the anatomical structures in the fMRI field of view, the method 700 of the present disclosure saves time and can be performed in a shorter period of time.

At operation 710 of the method 700, a plurality of activation levels is determined. The activation levels are related to the activity within the delineated geometries of anatomical structures. Stated another way, an activation level corresponds to an activity within a geometry of an anatomical structure. Accordingly, the activation levels for multiple geometries is determined. The activation levels are determined based on the aligned MR data and fMRI data.

FIG. 4 shows activation levels in control subjects' brains and activation levels in brains of subjects with mild traumatic brain injury (MTBI) when the subjects were subjected to dual N-back tasks. When the N-back level changes from 1-back to 0-back, the activation levels in control subjects' brains are shown in fMRI image 410 and the activation levels in MTBI subjects' brains are shown in fMRI image 420. When the N-back level changes from 2-back to 1-back, the activation levels in control subjects' brains are shown in fMRI image 412 and the activation levels in MTBI subjects' brains are shown in fMRI image 422. When the N-back level changes from 3-back to 2-back, the activation levels in control subjects' brains are shown in fMRI image 414 and the activation levels in MTBI subjects' brains are shown in fMRI image 424. The changes in the ratio of oxygenated and deoxygenated blood can be used to a task-related time series of metabolic activities of different regions in the patient's brain. As can be seen in FIG. 4, while the difference in pattern and intensity of the activation levels are observable in fMRI images 410, 412, 414, 420, 422, and 424, the activation levels are not attributed to any geometry of a specific anatomical structure. Without anatomical-structure-specific activation levels, the activation levels within a specific anatomical structure cannot be quantified and meaningfully associated to a specific neurological disorder. The systems and methods of the present disclosure achieve just that. By segmenting the MR data and aligning the MR data with the fMRI data, the activation level, which can be an accumulated activation level, an instantaneous activation level, a time-average activation level, or an event-average activation level, in each of the geometries of the anatomical structures can be determined and associated with diagnosis of the patient.

Referring now to FIG. 5, shown therein is an MR image 500 of a brain of a patient overlaid with highlighted boundaries of the geometries of multiple anatomical structures, including a geometry of thalamus 510 and corpus callosum 520. In some embodiments, with the MR data automatically segmented at operation 704 and the MR data aligned with the fMRI data at operation 708, the computing device 120 can determine an activation level within a geometry (for example, the geometry of the thalamus 510) and another activation level within another geometry (for example, the geometry of the corpus callosum 520. Those activation levels can be accumulated activation levels, instantaneous activation levels, time-average activation levels, event-average activation levels, or another type of activation level. In some embodiments, activation levels are also determined for additional, other geometries.

At operation 712 of the method 700, a sequence of activation is determined. The computing device 120 can determine a pattern or sequence of activation in different anatomical structures. For example, an activation level in the geometry of thalamus 510 may increase while the activation level in the geometry of the corpus callosum 520 increases, and then the activation level in the geometry of the corpus callosum 520 can increase in response to a dual N-back task while the activation level in the geometry of thalamus 510 wanes in response to the same task. In other embodiments, the sequence of activation levels in even more geometries can be determined. Besides quantitative intensities of activation levels, the pattern/sequence of the activation among different anatomical structure in response to a task or stimulation can also be indicative of a neurological disorder or condition. The sequence of activation is determined based on the order or timing of the MR data and fMRI data.

At operation 714 of the method 700, a propagation of activity between anatomical structures is determined. For example, based on the determined activation levels corresponding to respective delineated geometries of anatomical structures, the progression of activity over time from an anatomical structure to another anatomical structure and on to another anatomical structure can be determined, thereby indicating a propagation of activity in the patient's brain. The propagation of activity is determined based on the order or timing of the MR data and fMRI data. In some embodiments, the determined activation level is associated with a single structure or all delineated structures, or a subset of structures in a specific order, depending on the propagation of brain activity with a diagnosis of the patient with respect to neurological diseases or neuropsychiatric disorders.

At operation 716 of the method 700, a graphical representation of a dynamic activity in the brain is outputted. The dynamic activity includes at least one of the sequence of activation of the anatomical structures and the propagation of activity between the anatomical structures. The graphical representation may further include the delineated geometries of the anatomical structures included in the representation as well as the corresponding activation levels for those delineated geometries. Some embodiments may further include temporal features related to the dynamic activity. In some embodiments, the graphical representation will include brain activity map or an anatomical-structure-specific brain activity map.

Referring to FIG. 6, illustrated therein is an exemplary graphical representation 600 of activation levels within the geometry of thalamus 510 of the brain. The graphical representation 600 in FIG. 6 can also be referred to as a brain activity map or an anatomical-structure-specific brain activity map. As shown in FIG. 6, the activation level within the geometry of the thalamus 510 is graphically represented by a graphical overlay 610. In some embodiments represented by FIG. 6, the graphical overlay 610 includes color-coded contours of different activation levels. As used herein, activation levels can be accumulated activation levels, instantaneous activation levels, time-average activation levels, or event-average activation levels. In those embodiments, the darker color near the edge of the geometry of the thalamus 510 represents lower activation levels than the lighter color near the center of the geometry of the thalamus 510. Similarly, the activation level within the geometry of the corpus callosum 520 is graphically represented by a graphical overlay 620. The graphical overlay 620 also includes color-coded contours of different activation levels. The darker color along the length of the second geometry of the corpus callosum 520 represents lower activation levels than the lighter color near either end (e.g., splenium of corpus callosum and genu of corpus callosum) of the second geometry of the corpus callosum 520. It is noted that the graphical representation 600 is for illustration purposes only and does not necessarily correspond to a real-world brain activity map.

Different from the fMRI images shown in FIG. 4, the activation level is specific to the geometry of the thalamus 510 and is not an activation level over a region that merely includes the geometry. The method 700 of the present disclosure therefore allows for determination of anatomical-structure-specific activation levels. The ability to determine anatomical-structure-specific activation levels eliminates the subjectivity in visually matching the activity level to an anatomical structure, thus reducing the level of expertise required to interpret fMRI data. In some embodiments, a diagnosis of a physician can be received by the computing device 120. The diagnosis can either be positive, indicating that the patient suffers from at least one neurological disorder or negative, indicating that the patient is free of all neurological disorders. It is noted that the diagnosis here is not necessarily rendered solely based on the fMRI data but is based on all tests and examinations performed on the patient. In some embodiments, if the diagnosis of a patient is negative, the activation levels, geometries of anatomical structures and sequence of activation will be associated with a healthy subject. In some embodiments, if the diagnosis of a patient is positive, the activation levels, geometries of anatomical structures, and sequence of activation will be associated with the neurological disorder(s) identified in the diagnosis of the patient.

At operation 716 of the method 700, the activation levels within the geometries of the anatomical structures, geometries of anatomical structures, and the sequence of activation among the anatomical structures, being associated with the diagnosis of the patient with respect to the brain, are stored in a database, such as the database 150. Over time, the database 150 can store activation levels and sequences of activation of more healthy subjects and activation levels and sequences of activation of more subjects with neurological disorders. fMRI biomarkers of neurological disorders can be detected and developed based on the data stored in the database 150.

The systems, devices, and methods of the present disclosure can include features described in U.S. Provisional App. No. 62/711,812, the entireties of which is hereby incorporated by reference herein.

Persons skilled in the art will recognize that the apparatus, systems, and methods described above can be modified in various ways. Accordingly, persons of ordinary skill in the art will appreciate that the embodiments encompassed by the present disclosure are not limited to the particular exemplary embodiments described above. In that regard, although illustrative embodiments have been shown and described, a wide range of modification, change, and substitution is contemplated in the foregoing disclosure. It is understood that such variations may be made to the foregoing without departing from the scope of the present disclosure. Accordingly, it is appropriate that the appended claims be construed broadly and in a manner consistent with the present disclosure.

What is claimed is:

1. A method for obtaining anatomical-structure-specific activation data in a brain of a patient, comprising:
   receiving magnetic resonance (MR) data of the brain obtained by use of a magnetic resonance imaging (MRI) device, wherein the MR data includes MR data of anatomical structures in the patient's brain;
   segmenting the MR data of the brain to delineate a plurality of geometries, each of the plurality of geometries corresponding to a respective anatomical structure in the brain, wherein the segmenting is based on a shape constrained deformable three-dimensional (3D) brain model involving adapting the 3D brain model to anatomical structures in the brain;
   receiving functional magnetic resonance (fMRI) data of the brain obtained by use of an MRI device;
   aligning the MR data and the fMRI data;
   determining a plurality of activation levels, each of the activation levels corresponding to respective delineated geometries based on the aligned MR data and fMRI data;
   determining a sequence of activation of the anatomical structures based on the delineated geometries and the corresponding activation levels, and wherein the sequence of activation is determined based on the order or timing of the MR data and fMRI data;
   determining a propagation of activity from one delineated geometry to another delineated geometry based on the delineated geometries and the corresponding activation levels, and wherein the propagation of activity is determined based on the order or timing of the MR data and fMRI data; and
   outputting a graphical representation of a dynamic activity in the brain corresponding to the delineated geometries of the anatomical structures, and wherein the graphical representation of the dynamic activity further comprises the sequence of activation and the propagation of activity.

2. The method of claim 1, wherein the graphical representation of the dynamic activity comprises a brain activity map including at least one of the geometries.

3. The method of claim 1, further comprising:
   associating at least one determined activation level and delineated geometry with a diagnosis of the patient.

4. The method of claim 1, wherein at least one of the activation levels comprises an average activation level.

5. The method of claim 4, wherein the average activation level comprises an event-average activation level.

6. A system for obtaining anatomical-structure-specific activation data in a brain of a patient, comprising:
   a computing device in communication with a magnetic resonance imaging (MRI) device, the computing device operable to:
      receive magnetic resonance (MR) data of the brain obtained by use of a magnetic resonance imaging (MRI) device, wherein the MR data includes MR data of anatomical structures in the patient's brain;
      segment the MR data of the brain to delineate a plurality of geometries, each of the plurality of geometries corresponding to a respective anatomical structure in the brain, wherein the segmentation is based on a shape constrained deformable 3D brain model involving adaptation of the three-dimensional (3D) brain model to anatomical structures in the brain;

receive functional magnetic resonance (fMRI) data of the brain obtained by use of an MRI device;

align the MR data and the fMRI data;

determine a plurality of activation levels, each of the activation levels corresponding to the respective delineated geometries based on the aligned MR data and fMRI data;

determine a sequence of activation of the anatomical structures based on the delineated geometries and the corresponding activation levels, and wherein the sequence of activation is determined based on the order or timing of the MR data and fMRI data;

determine a propagation of activity from one delineated geometry to another delineated geometry based on the delineated geometries and the corresponding activation levels, and wherein the propagation of activity is determined based on the order or timing of the MR data and fMRI data and output a graphical representation of a dynamic activity in the brain corresponding to the delineated geometries of the anatomical structures.

7. The system of claim 6, further comprising at least one of the MRI device and the database.

8. The system of claim 6, wherein the computing device is further operable to associate activation levels within anatomical structures and the sequence of activation with a diagnosis of the patient with respect to the brain.

9. The system of claim 8, wherein the computing device is further operable to store, in a database, the activation levels of respective anatomical structures and the sequence of activation of the anatomical structures with a diagnosis of the patient with respect to the brain.

* * * * *